United States Patent [19]

Geipel, Jr. et al.

[11] 4,329,773

[45] May 18, 1982

[54] METHOD OF MAKING LOW LEAKAGE SHALLOW JUNCTION IGFET DEVICES

[75] Inventors: Henry J. Geipel, Jr., Essex Junction; Richard B. Shasteen, Colchester, both of Vt.

[73] Assignee: International Business Machines Corp., Armonk, N.Y.

[21] Appl. No.: 214,940

[22] Filed: Dec. 10, 1980

[51] Int. Cl.$^3$ .................. H01L 21/22; H01L 21/26
[52] U.S. Cl. .................. 29/571; 29/576 B; 29/577 C; 148/1.5; 148/187
[58] Field of Search ............... 29/571, 576 B, 577 C; 148/1.5, 187

[56] References Cited

U.S. PATENT DOCUMENTS

| | | | |
|---|---|---|---|
| 4,118,250 | 10/1978 | Horng et al. | 148/1.5 |
| 4,151,010 | 4/1979 | Goth | 148/1.5 |
| 4,160,987 | 7/1979 | Dennard et al. | 357/41 |
| 4,170,492 | 10/1979 | Bartlett et al. | 148/1.5 |
| 4,170,500 | 10/1979 | Crossley | 148/187 |
| 4,258,077 | 3/1981 | Mori et al. | 148/1.5 X |
| 4,282,646 | 8/1981 | Fortino et al. | 29/571 |
| 4,294,002 | 10/1981 | Jambotkar et al. | 29/576 B |

OTHER PUBLICATIONS

Dennard et al., "Design of Ion–Implanted Mosfet's . . . ," IEEE J. Solid–State Circuits, vol. SC–9, No. 5 (10/74), pp. 256–267.
Prussin et al., "Adaption of Ion Implantation . . . ," Extended Abstracts, Electro Chem. Soc., Spring Meeting, vol. 74–1, Abst. #85, May 12–17, 1974, pp. 213–215.
Bogardus et al., "Removal of Implant Damage," IBM Tech. Discl. Bull., vol. 18, No. 10, (3/76), p. 3301.
Tice, et al., "The Isochronal Annealing . . . of Silicon . . . ," Extended Abstracts, Electrochem. Soc. Fall Meeting, vol. 76–2 Abs. #334, Oct. 17–21, 1976, pp. 863–864.
Varma et al., "Abrupt Junctions by Ion–Implantation . . . ," Extended Abstracts, Electrochem. Soc. Spring Meeting, vol. 79–1, Abs. #112, May 6–11, 1979, pp. 310–313.
Wada et al., "Arsenic Ion–Implanted Shallow Junction," J. Electrochem. Soc., vol. 127, No. 2 (1980) pp. 461–466.
Müller et al., "Influence of an Oxidizing Annealing Ambient . . . ," J. Electrochem. Soc., vol. 122, No. 9 (1975), pp. 1234–1238.
Hunter et al., "1$\mu$m Mosfet VLSI Technology: Part V . . . ," IEEE Tr. Electron Devices, vol. ED–26, No. 4 (1979), pp. 353–359.
Geipel et al., "Low Leakage Implanted Source," IBM Tech. Discl. Bull., vol. 18, No. 2 (1975), p. 337.

*Primary Examiner*—G. Ozaki
*Attorney, Agent, or Firm*—Howard J. Walter, Jr.

[57] ABSTRACT

A method for forming shallow low leakage ion implanted source/drain regions in an integrated circuit environment including semirecessed oxide isolation regions in which high parasitic device threshold voltages are provided by an oxidizing/annealing post implant process. Arsenic ions are implanted into a recessed oxide isolated substrate followed by a wet oxidation process and a non-oxidizing annealing process for a period of time to provide a passivating dielectric over low leakage source/drain regions of less than one micron junction depth and to provide adequate high temperature annealing to reduce the charge effects in the oxide isolation regions caused by the implanted arsenic ions.

7 Claims, No Drawings

METHOD OF MAKING LOW LEAKAGE SHALLOW JUNCTION IGFET DEVICES

BACKGROUND OF THE INVENTION

1. Field of the Invention

This invention relates to methods of manufacturing field-effect semiconductor devices and more particularly to a method of providing self-aligned polysilicon gate IGFET devices having low leakage, shallow junction source/drain regions by the use of ion implantation and diffusion techniques.

2. Description of the Prior Art

Traditionally, n-channel IGFET source/drain junctions have been formed by thermal diffusion from chemical sources such as doped oxides. Advances in semiconductor processing have led to the introduction of such features as recessed oxide isolation, for example see the article, "Selective Oxidation of Silicon and its Device Applications," E. Kooi et al., *Semiconductor Silicon* 1973, Electrochemical Society, pp. 860-879. More recent trends have led to smaller horizontal device geometries which also require scaling of vertical geometries as well. The article, "Design of Ion-Implanted MOSFET's with Very Small Physical Dimensions," R. H. Dennard et al., *IEEE J. Solid-State Circuits*, Vol. SC-9, No. 5, October 1974, pp. 256-267, describes some of the design criteria necessary to achieve device scaling. Because of the requirement for low resistivity, shallow source/drain regions the use of conventional thermal diffusion becomes unacceptable. Ion-implantation, with its ability to provide controlled quantity and location of dopant atoms, has become the acceptable choice for providing junction regions in scaled down devices. Dennard et al. suggest the direct ion implant of dopant through a thin gate oxide to form source/drain regions. U.S. Pat. No. 4,160,987 (Dennard et al.) describes a more detailed fabrication process in which self-aligned source/drain regions are formed by ion implanting arsenic at about 100 KeV energy and $4 \times 10^{15}$ ions/cm$^2$ dosage. [Designation of exponential powers of ten will hereinafter be expressed for example as: 4E15 dose.] The arsenic is implanted conveniently through a gate oxide layer and thereafter subjected to a thermal oxidation process at about 1000° C. to grow a silicon dioxide junction passivating layer of between 1500 and 5000 Angstroms. This process electrically activates the implanted ions and provides for some diffusion into the silicon substrate. A variation in this post implant process is taught in U.S. Pat. No. 4,170,492 (Bartlett et al.) in which a lower temperature, non-annealing oxidizing step is used to enhance the growth of oxide over implanted regions.

Because ion implantation is a damage-producing technique due to the physical impact of energetic ions, thermal annealing of implanted cyrstalline silicon is critically important to providing good electrical characteristics of finished devices. Many processes, like that of Bartlett, above, may provide insufficient annealing. Any remaining, or residual, implant damage when made electrically active can enhance the reverse bias junction leakage current if the damage lies near the junction depletion regions.

Many references are available which relate to processing techniques for reducing ion implantation caused damage. For example, the article, "Adaption of Ion Implantation for Integrated Circuits," S. Prussin et al., Extended Abstracts, Vol. 74-1, Spring Meeting of the Electrochemical Society, May 12-17, 1974, Abstract 85, pp. 213-5, emphasizes the importance of a non-oxidizing thermal annealing step following the ion implant of phosphorus in order to provide low leakage junctions. E. H. Bogardus et al. in the article, "Removal of Implant Damage," *IBM Technical Disclosure Bulletin*, Vol. 18, No. 10, March 1976, p. 3301, suggests that a mildly oxidizing atmosphere be used to provide low leakage arsenic implanted junction formed with the use of a screen oxide.

While the use of a screen oxide is advantageous from a processing point of view, as it protects against the introduction of undesirable impurities, W. K. Tice et al. in their paper, "The Isochronal Annealing Behavior of Silicon Implanted with Arsenic Ions," Abstract No. 334, Extended Abstracts Vol. 76-2, Fall Meeting of The Electrochemical Society, October 17-22, 1976, pp. 863-4, reported that thermal annealing of arsenic implanted at 150 KeV with a dose of 8E15 through a 200 Angstrom screen oxide showed deep-lying dislocation defects after thirty minutes anneal in a non-oxidizing atmosphere at 1100° C. Yet, R. Varma et al. in their paper, "Abrupt Junctions by Ion-Implantation Doping of Silicon and Monitoring Damage-Annealing by Laser Raman Scattering," Abstract No. 112, Extended Abstracts, Vol. 79-1, Spring Meeting of the Electrochemical Society, May 6-11, 1979, pp. 310-313, reported that the presence of a screen oxide prevents non-annealable damage when ion implant of arsenic was followed by nitrogen annealing at temperatures between 558° and 704° C., temperatures at which little thermal diffusion occurs. The recent paper by Wada et al, "Arsenic Ion Implanted Shallow Junction," *J. Electrochemical Society*, Vol. 127, No. 2, February 1980, pp. 461-6, further examines the non-oxidizing annealing of arsenic ion implanted through a screen oxide to provide shallow junctions of less than one micron and found that, although knock-on oxygen provided a source for non-annealable crystalline defects, adequate thermal annealing with its inherent diffusion of impurity enables the containment of defects within the dopant profile.

While all of the above references relate primarily to the formation of ion-implanted junctions with little or no movement of the as-implanted dopant profile, other techniques in which the ion-implanted region is used primarily as a pre-diffusion source are also known. For example, H. Müller et al., in their article, "Influence of an Oxidizing Annealing Ambient on the distribution of As, Sb, and Ga Implanted into Silicon," *J. Electrochemical Society*, Vol. 122, No. 9, September 1975, pp. 1234-8, describe the effects of an oxidizing anneal on arsenic implanted into bare silicon and show that as the silicon surface is oxidized the implanted arsenic is pushed ahead of the oxidation front. Experiments were carried out by wet oxygen and steam annealing and demonstrated that little or no alteration of the arsenic concentration profile occurs between the temperatures of 850° and 1000° C. However, when the oxidation step was followed by annealing in nitrogen for 20 minutes at 1000° C. substantial diffusion of the arsenic occured.

In attempting to utilize ion implantation techniques to fabricate integrated circuit MOSFET devices we initially chose to use a technique similar to that described by the above Dennard et al. references. That is we chose to use the MOSFET gate oxide as a screen through which a high dose of arsenic was implanted. This was followed by an oxidation process to provide silicon surface and polysilicon gate passivation and to allow the implanted arsenic to diffuse to a junction depth of about one-half a micron. As recently reported by W. R. Hunter et al., *IEEE TR. Electron Devices*, Vol. EO-26, No. 4, April 1979, pp. 353-9, we found that thick oxide parasitic device threshold voltages were unsatisfactory due to the apparent field provided by trapped holes present in the semi-recessed field oxide regions. Since the source/drain arsenic implants were carried out without a blocking mask other then that of the field oxide and the polysilicon gate electrodes, the cause of the trapped charge was attributed to the presence of arsenic in the upper portion of the field oxide. Our initial attempt to remove the implant-caused charges was to increase the initial thickness of the field oxide and then to etch away the arsenic containing oxide, see the article "Low Leakage Implanted Source," H. J. Geipel and R. B. Shasteen, *IBM Technical Disclosure Bulletin*, Vol. 18, No. 2 July 1975, p. 337. Although this technique eliminated the arsenic from the field oxide regions it also removed the protective screen oxide as well. In addition, when used with the semi-recessed oxide isolation scheme of Kooi et al, the etching also increased the areas of the diffused regions, attacked the thermal oxide on previously oxidized first level polysilicon and undercut the gate oxide of self-aligned polysilicon gate devices, all of which are extremely important areas of device design sensitivity. Hunter et al. used a two-step etching process which involved removal of the screen oxide and a portion of the arsenic contaminated field oxide, followed by growth of thin thermal oxide over the implanted regions and a second etching step to remove more of the arsenic contaminated field oxide. Although this etchback technique was effective in raising the thick isolation oxide threshold voltage by a factor of 2, the additional process steps required are undesirable in a semiconductor process in which each additional step decreases product yield.

SUMMARY OF THE INVENTION

Accordingly it is an object of this invention to provide a semiconductor process for the formation of high density integrated circuit IGFET devices having junction depths of less than one micron in which an ion implantation/diffusion process is used to provide field oxide parasitic devices having high threshold voltages, low leakage current and adequate breakdown voltages.

The method is implemented in an n-channel IGFET semiconductor manufacturing process by providing semi-recessed field oxide isolation regions on a semiconductor substrate, forming dielectrically insulated gate electrodes in active device regions, ion implanting arsenic ions into regions of the substrate not protected by field oxide or gate electrodes such that the maximum concentration of arsenic in the substrate lies substantially at the surface of the substrate, exposing the substrate to a drive-in wet oxidation process to oxidize the ion implanted regions to a thickness greater than that of the projected range, $R_p$, of the implanted ions and then annealing in a non-oxidizing atmosphere at a temperature between 900° and 1100° C. The total time for the oxidation and annealing step is in excess of the time required to grow thermal oxide over the implanted regions and is determined by the ion implant energy and dose, the oxidizing/anneal temperature and the field oxide thickness. The extended time at temperature is necessary in order to reduce the effects of implanted arsenic ions on the threshold voltage of parasitic devices formed under the field oxide and to provide for sufficient thermal diffusion of the implanted arsenic beyond oxygen causing defects in the semiconductor substrate.

DESCRIPTION OF THE PREFERRED EMBODIMENT

The preferred embodiment of this invention is described in conjunction with a particular process for providing self-aligned polysilicon gate IGFET devices. Generally, the preferred process may be implemented as follows. Starting with a boron doped silicon semiconductor wafer of about 12 ohm-centimeter resistivity and having its major surface parallel to the 100 crystalline plane, a thin thermal silicon dioxide layer is grown followed by the chemical vapor deposition of a silicon nitride layer. This composite layer is patterned by known photolithographic masking and etching techniques to remove the silicon nitride in areas where devices are to be formed. A field threshold voltage tailoring step is performed by ion implanting boron ions at an energy of about 80 to 150 KeV and a dosage of about 1 to 5E13 ions/cm$^2$. This is followed by the thermal oxidation of the wafer in a dry-wet-dry oxidation atmosphere to provide about 3500 to 10,000 Angstroms of semi-recessed dielectric oxide, generally referred to as ROX, in all areas of the wafer not protected by the previously defined silicon nitride layer. The ion implanted boron diffuses faster than the surface of the wafer is oxidized to provide p+ type semiconductor regions under ROX regions which act as channel stoppers between active device areas by raising the inversion threshold voltage under the ROX areas, as is well known in the art. The remaining oxide/nitride masking layer is then removed by etching followed by the thermal growth of 150 to 800 Angstroms of silicon dioxide which will act as the gate insulator layer. In order to provide positive enhancement IGFET threshold voltages boron is next ion implanted at an energy of about 30 to 100 Kev and a dose of about 1E11 to 2E12 ions/cm$^2$ in the channel region. Next phosphorus doped polysilicon is deposited by chemical vapor deposition to a thickness of about 1000 to 5000 Angstroms. If a double polysilicon process is desired a layer of pyrolytic silicon dioxide may be deposited at this point followed by patterned etching of the oxide covered polysilicon, removal of thin thermal oxide not protected by oxidized polysilicon, subsequent thermal oxidation of the substrate surface and exposed polysilicon edges and deposition of a second doped polysilicon layer. In either a single or double layer polysilicon process the last deposited layer of polysilicon is etched to form IGFET gate electrodes. Retaining or removing and regrowing the gate dielectric over remaining portions of the substrate to act as an ion implantation screen in the next step is optional at this point.

Source and drain regions are next formed by the ion implantation/drive-in process using both the polysilicon and ROX areas as a mask. Previous experience had indicated that arsenic ions implanted at an energy of about 20 to 120 Kev, depending upon the presence of a gate insulator/screen oxide thickness, with a dose of 3E15 to 1.2E16 ions/cm$^2$ followed by an oxidizing drive-in process will provide satisfactory source/drain regions having a junction depth of less than 1.0 microns. This is followed by an oxidation process to provide an oxide layer over polysilicon gate electrode and implanted source/drain regions. The drive-in process is followed by deposition of passivating phosphorus doped glass layer followed by an anneal step in nitrogen. The resulting junctions provide adequate electrical breakdown and leakage characteristics for use in integrated circuits powered by drain supply voltage on the order of about 5.0 volts.

As already mentioned, above, this process sequence, including additional known metallization and passivation steps, provides source/drain regions for IGFET devices having desirable electrical characteristics for use in integrated circuits. However, we have found that the presence of implanted arsenic in the semi-recessed oxide leads to lowered parasitic device threshold voltages rendering the finished integrated circuit devices unacceptable as product.

We have discovered that the presence of positive charge in the field oxide regions due to the presence of positively charged arsenic ions can be eliminated if the following procedure is followed after the ion implant step. First, wet oxidation of the implanted regions is carried out such that the thickness of the grown thermal oxide over the implanted regions is greater than the projected range Rp of the implanted arsenic plus about four times the standard deviation, normally referred to as "sigma" or $\Delta Rp$. The purpose of the oxidation step is to consume an amount of the silicon substrate surface in which the greatest quantity of implantation caused defects occur. When the oxidation is carried out in a temperature range of about 900° to 1100° C., the thermal diffusion rate of arsenic in silicon is greater than the rate of movement of the oxidation front. Thus, substantially all of the arsenic will still be present in the silicon substrate very close to the surface of the substrate under the thermal oxide. We also found that, although some reduction in the effects of the arsenic in the field region occured during post-implant oxidation, it was necessary to extend the time at temperature in order to completely remove these effects. The observed low parasitic device threshold voltage effects are believed to be due to the presence of charge centers caused by the implanted arsenic present in the field oxide for any particular combination of field oxide thickness, implant conditions, and annealing temperature, the time required to reduce these effects was found to have a critical minimum at which a substantial reduction in parasitic effects occurs. Within the ranges of parameters specified above, the critical minimum time, was found to be greater than that required to grow acceptable passivating thermal oxide over the implanted regions. Thus, it is important to provide additional non-oxidizing thermal annealing in order to extend the time at temperature beyond the critical time. Although, with respect to the field oxide, additional oxidation would produce similar results, the additional thermal oxide thickness causes contact hole etching to diffused regions to become difficult and also causes excess oxidation of the polysilicon electrodes. This additional non-oxidizing annealing also enables the thermal diffusion of arsenic to form a diffused junction in the substrate having a depth between 0.25 and 0.75 microns. The additional thermal annealing was accomplished by introducing a non-oxidizing atmosphere, nitrogen, into the oxidation chamber. We have found that the minimum time at temperature for the combined wet oxidation/anneal process is about 30 minutes at 1000° C. Periods of less than 30 minutes, although in some instances may be adequate to grow the thermal oxide, are insufficient to anneal out the charge effects in the field regions of the substrate.

It is preferable to utilize a screen oxide, normally available as the gate dielectric, in order to provide a minimum implant damage to the silicon surface. When a screen oxide is used the arsenic implant energy should be selected to place the Rp at the oxide-silicon interface.

The preferred process related specifically to the source drain junction formation consist of the following steps.

1. Following definition of the polysilicon gate electrode the semiconductor wafers are cleaned using a combination acid wash, brush clean and a basic-acidic clean.

2. Arsenic (75 As+) is pre-deposited by ion implanting through a 450A screen gate oxide at 80 KeV with a dose of 8E15 ions/cm$^2$ in a commercial ion implantation tool.

3. Implanted wafers are then post-implant cleaned by a plasma ashing step for 2 minutes in an oxygen plasma followed by a basic-acidic cleaning process.

4. A dry/wet/dry oxidizing-anneal step follows consisting of 10 minutes in oxygen, 18 minutes in water/HCl, 40 minutes in oxygen and 45 minutes in nitrogen at 1000° C. This produced about 2500 Angstroms of oxide over the polysilicon gate electrodes.

5. A passivation layer of phosphosilicate glass (PSG) of about 2500 Angstrom is deposited at 750° C. by chemical vapor deposition.

6. A PSG anneal, for example, 12 minutes in nitrogen at 1050° C. completes the junction formation.

7. Device metallurgy and passivation layers are applied as required to complete the integrated circuit device.

The arsenic dose was chosen to provide a maximum concentration of electrically active arsenic in the silicon substrate at the processing temperatures used. Larger doses, although possible to achieve, lead to clustering of arsenic and produce low quality junctions.

Some of the electrical characteristics of the source/drain junction regions produced include a junction depth of about 0.46 micron, resistivity of about 17.6 ohms/square, junction breakdown voltage to field oxide of about 19.8 volts, and a reverse biased junction leakage current on the order of about 0.01 nanoamp/cm$^2$, close to the theoretical limit.

While the invention has been described particularly with respect to a single preferred process, those skilled in the art know that the exact material thicknesses, times and temperatures are subject to variation depending upon individual device or process design constraints.

What is claimed is:

1. A method of forming integrated circuit IGFET devices having ion implanted and diffused source and drain regions comprising the steps of:

providing on a semiconductor substrate first selected regions of thermally grown oxide to provide dielectric isolation means between said IGFET devices;

forming insulated gate electrodes over at least some second selected regions of said substrate;

ion implanting arsenic ions into remaining regions of said substrate using said dielectric isolation means and said gate electrodes as masking means, said arsenic ions being implanted so as to provide a maximum concentration substantially at the upper surface of said remaining regions of said substrate, said maximum concentration being substantially equal to, or greater than, that of the maximum solid solubility of arsenic in the substrate; and exposing said substrate to an oxidizing/annealing atmosphere between the temperatures of about 900° C. and 1100° C. by, first, exposing said substrate to an oxidizing atmosphere, including a wet oxidation step, for a period of time determined to provide an oxide thickness on said remaining regions of said substrate at least equal that of the projected range, Rp, of the implanted arsenic plus four times the standard deviation, sigma, of said implanted arsenic and, second, exposing said substrate to a non-oxidizing atmosphere for an additional period of time such that the effect of charge produced by said implanted arsenic ions in said dielectric isolation means is minimized.

2. The method of claim 1 wherein a thermal screen oxide having a thickness of between 150 and 800 Angstroms is provided over at least said remaining regions prior to said ion implantation step.

3. The method of claim 2 wherein said oxidizing atmosphere sequentially comprises exposure to dry oxygen, exposure to wet oxygen and exposure to dry oxygen.

4. The method of claim 3 wherein said non-oxidizing atmosphere comprises nitrogen.

5. The method of claim 4 wherein the time periods for said dry, wet, dry oxidation are about ten, eighteen and forty minutes, respectively, and wherein the time period in nitrogen is about forty minutes.

6. The method of claim 5 wherein said dielectric isolation means has a thickness of 3500 to 10,000 Angstroms, said gate electrodes have a thickness of between 1000 and 5000 Angstroms and said arsenic is implanted at an energy between 20 to 120 kilovolts at a dose of between $3 \times 10^{15}$ and $1.2 \times 10^{16}$ ions per square centimeter.

7. The method of providing integrated circuit IGFET devices having high threshold voltage field dielectric isolation means comprising the steps of:

providing a patterned layer of oxidation inhibiting masking material on a surface of a silicon semiconductor substrate having a predetermined concentration of p-type impurity, said patterned layer defining areas of said substrate in which IGFET devices are to be formed;

ion implanting p-type impurities into the remainder of said surface in order to increase the concentration of p-type impurity at said surface;

thermally oxidizing said substrate to form a layer of thick silicon dioxide of between 3500 and 10,000 Angstroms in thickness on said substrate;

removing said oxidation inhibiting masking layer to expose said surface of said silicon substrate in areas other than those covered by said layer of thick silicon dioxide, thermally oxidizing said exposed areas of said substrate to provide a gate dielectric layer having a thickness of between 150 and 800 Angstroms in thickness;

selectively providing polysilicon gate electrodes over at least portions of said gate dielectric layer;

ion implanting arsenic ions into said substrate at an energy of between 20 to 120 kilovolts at a dose of between $3 \times 10^{15}$ and $1.2 \times 10^{16}$ ions per square centimeter such that the projected range, Rp, of said arsenic ions lies substantially at the interface between said gate dielectric layer and said silicon substrate;

exposing said implanted substrate to an oxidizing atmosphere at a temperature between 900° and 1000° C. in order to grow silicon dioxide over implanted areas of said substrate to a thickness at least equal to the quantity Rp plus four times the standard deviation, sigma, for the implanted arsenic; and further exposing said substrate to a non-oxidizing atmosphere at a temperature substantially equal to that of said oxidizing atmosphere for a time period sufficiently long such that the total time at temperature in both said oxidizing and non-oxidizing atmospheres is such that the effects of charge produced by said implanted arsenic ion in said layer of thick silicon dioxide is minimized.

* * * * *